US006799127B1

(12) United States Patent
Sontag et al.

(10) Patent No.: US 6,799,127 B1
(45) Date of Patent: Sep. 28, 2004

(54) SIGNAL TRANSITION AND STABLE REGIONS DIAGRAM FOR POSITIONING A LOGIC ANALYZER SAMPLE

(75) Inventors: David N Sontag, Colorado Springs, CO (US); Richard A Nygaard, Jr., Colorado Springs, CO (US); Jennifer Shay, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 596 days.

(21) Appl. No.: 09/634,068

(22) Filed: Aug. 8, 2000

(51) Int. Cl.[7] .................................................. G06F 3/05
(52) U.S. Cl. .............................. 702/68; 702/57; 702/79; 702/187
(58) Field of Search ............................ 702/57, 68, 79, 702/186–188, 121, 150, 177, 178; 707/4; 709/223; 370/352; 345/440

(56) References Cited

U.S. PATENT DOCUMENTS 6,054,984 A * 4/2000 Alexander .................. 345/339
6,246,408 B1 * 6/2001 Alexander .................. 345/348
6,396,517 B1 * 5/2002 Beck et al. ................. 345/771
6,463,392 B1 * 10/2002 Nygaard et al. ............. 702/89
6,556,223 B1 * 4/2003 Tran et al. .................. 345/804

* cited by examiner

Primary Examiner—Marc S. Hoff
Assistant Examiner—Felix Suarez
(74) Attorney, Agent, or Firm—Regan L. Trumper

(57) ABSTRACT

A system that allows an end user to optimize the performance of a logic analyzer quickly and easily is disclosed. A visual display allowing a user to see a data valid window and relative sample positions is provided. Direct graphical manipulation of the sample position allows for quick and accurate setting of sample positions. The present invention provides a graphical user interface generally comprised of the following components: a stable and transitioning data display; bus/signal labels; sample position time scale; an information icon; a timestamp icon; a graphical representation of suggested and selected sample position; a text display of selected sample position; and a legend. The present invention sets up the logic analyzer to correctly sample data from high speed, low margin systems. It measures data signals from the device under test relative to the user's state clock and automatically suggests the sampling position offset for each channel of the analyzer. The present invention allows the user to accept the suggestions or select alternative sampling positions manually.

12 Claims, 8 Drawing Sheets

SIGNAL TRANSITION AND STABLE REGIONS DIAGRAM FOR POSITIONING A LOGIC ANALYZER SAMPLE

FIELD OF THE INVENTION

In general, the present invention relates to the field of digital analysis and bus data generated from a device under test. More specifically, the present invention relates to accurately positioning a logic analyzer sample within the data valid window of a device under test.

BACKGROUND OF THE INVENTION

As known by those skilled in the art, a logic analyzer is an electronic instrument used to detect, analyze, and display digital voltage signals. Because of the increasing operational complexity of target devices, logic analyzers provide many configuration functions. In addition, as target devices continue to operate at faster speeds and with more complexities, simpler methods of interacting with the logic analyzer's user interface are needed.

Conventional logic analyzers include a graphical user interface that allows the user to select and configure a variety of features and functions built into the instrument. The graphical user interface is generally made available on a display integrated with the logic analyzer, and may additionally be made available on a remote terminal that communicates with the logic analyzer. A logic analyzer generally allows data sampling in a synchronous clock mode (i.e. state mode) or an asynchronous clock mode (i.e. timing mode). In a state mode measurement, the logic analyzer is clocked by a signal from the device under test. Each time the device under test's clock signal becomes valid, the analyzer samples the data. Since the analyzer's sampling is controlled by the device under test's clock, state mode measurements are said to be synchronous to the device under test. In a timing mode measurement, the logic analyzer is clocked according to its own internal clock signal. Since this clocking signal is not related to the clock from the device under test, timing mode measurements are said to be asynchronous to the device under test.

As with any synchronous digital circuit, a logic analyzer operating in a synchronous sampling mode (i.e. state mode) latches data appearing at its inputs on each active clock transition supplied by the device under test. Because of this, the analyzer requires the input logic signals to be stable for a period of time before the clock transition (setup time) and after the clock transition (hold time) so that it can accurately capture the desired data. This combination of setup and hold times is known as the analyzer's setup/hold window. The device under test is also has a setup/hold window that defines the length of time data will be valid on a bus. This is known as the data valid window. A critical relationship exists between the device under test's data valid window and the logic analyzer's setup/hold window. In order for the logic analyzer to capture valid data, its setup/hold window must be positioned within the device under test's data valid window as shown in FIG. 1. FIG. 1 shows a clock signal 100 and a representation of bus data 110. The data valid window 120 is shown relative to a clock signal transition 130. The logic analyzer's setup/hold window 140 must fit within the data valid window 120.

Because the position of the data valid window relative to the clock varies for different types of buses, logic analyzers must provide an adjustable setup/hold window so that the sample position can be optimized. As systems become faster, margins for error are becoming smaller. Setup precision is becoming more important.

Logic analyzers generally provide a simple user interface for adjusting the setup and hold values. FIG. 2 shows the setup/hold settings graphical user interface 200 from a prior art logic analyzer. This graphical user interface allows the user to adjust the setup/hold values 210 on each individual channel from 2.5 ns setup/0.0 ns hold to 0.0 ns setup/2.5 ns hold in 100 ps increments. This gives the user the control over the analyzer's sample position in the fine resolution needed to optimize the analyzer's sampling performance. While the user is presented with all of the functionality necessary for optimizing the logic analyzer's sample position, the prior art also presents the end user with numerous disadvantages and obstacles for defining the optimal setup/hold values quickly and accurately.

First, the end-user is provided no information concerning where the device under test's stable and transitioning data regions are relative to the dock edge. The user does not have any indication about how much the setup/hold window might need to be adjusted or in what direction.

Second, the user interface provides no visual feedback concerning the location of the setup/hold window relative to the data valid window. This leads to a lengthy and error prone trial and error approach to defining the necessary values.

A third disadvantage of the prior art is that the user interface uses standard default values for the setup/hold settings that have no relationship to the end user's device under test and are therefore a simple guess that may or may not work for the users measurements.

A fourth disadvantage is that while the user's real end goal is to correctly place the logic analyzer's sampling position in reference to the device under test's clock signal, the information is presented in terms of setup/hold values rather than sample position. Accordingly, the user must form a mental model of how these two concepts relate to on another.

Finally, the user can only see the setup/hold values for a single bus or single signal at any given time. In addition, the user cannot easily switch between setting values for individual signals or complete buses. If the user switches to the "All Bits" setting 220 (i.e. setting values for the bus as a whole) as shown in FIG. 2, all of the individual settings that may have been set will be lost.

Accordingly, there is a need for a logic analyzer graphical user interface with a visual display of where the actual stable and transitioning regions on each of the system's signals are in reference to the device under test's clock transition. There is also a need for displaying the logic analyzer settings in terms of sample position rather than setup/hold so that the user can more easily relate the information to their end goal. There is a further need to display the sample position visually relative to the clock edge and the stable and transitioning data regions. Finally, there is a need to display a suggested sample position as a default value that is relative to the device under test rather than a preset default sample position that is the same regardless of the device under test.

BRIEF DESCRIPTION OF THE DRAWINGS

The invention will be better understood from a reading of the following detailed description taken in conjunction with the drawings.

SUMMARY OF THE INVENTION

In light of the foregoing, the present invention provides a system that allows the end user to optimize the performance of the logic analyzer quickly and easily. The visual display allows them to see the data valid windows and the relative sample positions and eliminates the need for manual trial-and-error adjustments of the logic analyzer's setup/hold window. Direct manipulation of the sample position allows it to be set quickly and accurately. The display allows the user to position the sample positions relative to the actual data valid windows on the device under test. With the invention, it is not necessary to estimate the width and placement of the data valid window relative to the clock based on the theoretical design specifications of the target or secondary measurements made with an oscilloscope. The user is able to see precisely where a signal is stable and transitioning and where the logic analyzer's sample position is placed relative to those regions. In addition, the user is able to see the stable and transitioning regions of all of the signals on a bus relative to one another in one display, thus providing a powerful view for characterizing the signals on a bus. The visual display also makes it clear to the user whether an individual signal or the entire bus is being modified, thereby minimizing the risk of overwriting individual signal settings with an accidental click of a button. Further, the logic analyzer's settings are presented in terms of sample position with respect to the clock edge rather than setup/hold windows. This concept is much more tangible and understandable to the user and it eliminates confusion between the device under test's setup/hold specifications and the logic analyzer's setup/hold specifications. In addition, the display allows the user to see a clear picture of the relationship between signals. If two buses share a channel, for example, the user can see adjustments made to that channel in both bus displays.

The present invention provides a graphical user interface generally comprised of the following components: a stable and transitioning data display; bus/signal labels; sample position time scale; an information icon; a timestamp icon; a graphical representation of suggested and selected sample position; a text display of selected sample position; and a legend. The present invention sets up the logic analyzer to correctly sample data from high speed, low margin systems. It measures data signals from the device under test relative to the user's state clock and automatically determines the sampling position offset for each channel of the analyzer.

DETAILED DESCRIPTION

A novel graphical user interface for a logic analyzer that supports an improved and more intuitive approach for placing logic analyzer sample positions using a graphical display of the logic analyzers sample positions with respect to the device under test's stable and transitioning regions is described in detail hereinafter.

Figure 1:
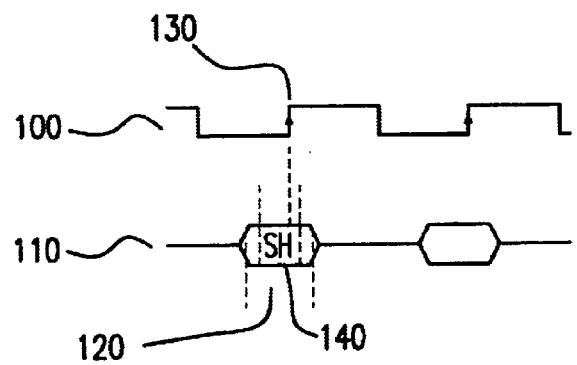
FIG. 1 is an illustration of a data valid window and setup/hold window.
Figure 2:
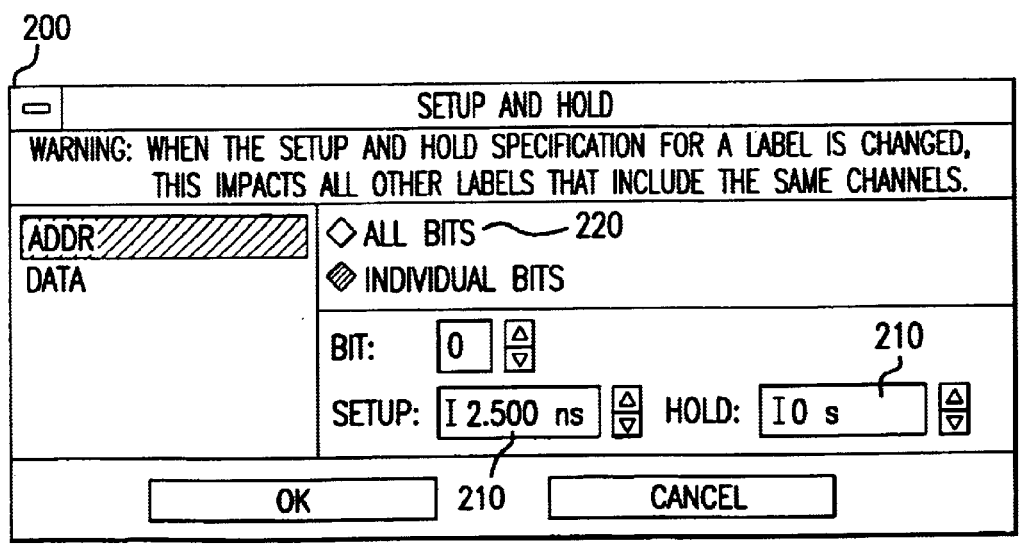
FIG. 2 is a prior art logic analyzer user interface for setup and hold functions.
Figure 3:
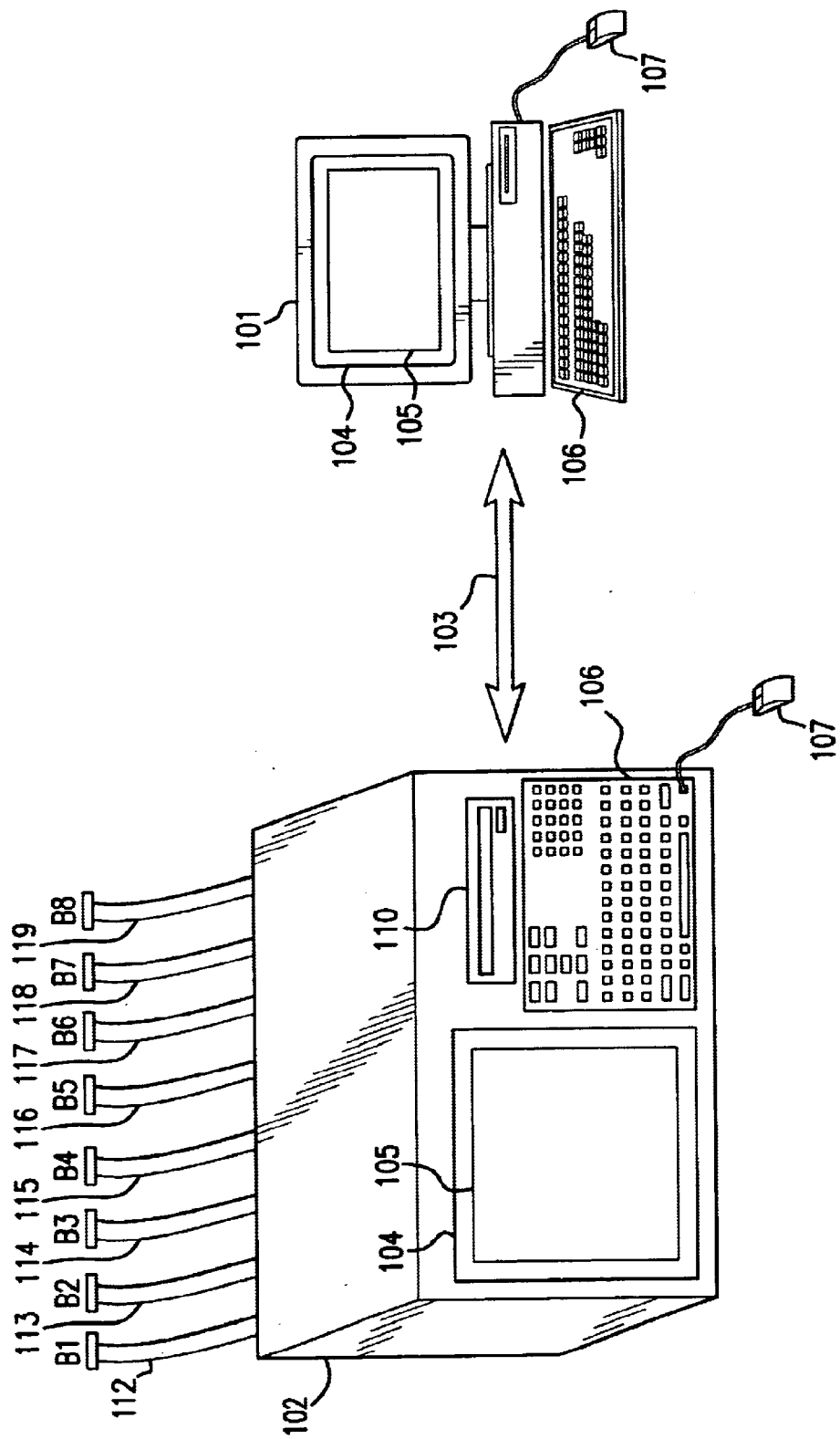
FIG. 3 is a frontal view of a logic analyzer such as would be used in the present invention.

FIG. 3 is a frontal view of a logic analyzer 302 such as would be used in the present invention. In the preferred embodiment, the logic analyzer 302 is the Agilent Technologies 16700/702B series logic analyzer mainframes and the 16715, 16716, 16717, 16718, 16719 etc. logic analyzer cards. The logic analyzer 302 is user-controlled with a keyboard 306 and mouse 307. The user may select various control menus with the keyboard 306 and mouse 307. Disc drive 310 is available for loading and storing software. Setup configuration and format screens, digital signal readouts and digital signal waveforms are displayed on display screen 304.

Logic analyzer 302 provides a set of pods 312–319 (B1–B8), each of which comprises a pin connector that couples a set of pins to internal circuitry of logic analyzer 302 via a cable. Display 104 displays a graphical user interface 305 that allows a user to configure and set up operation of the logic analyzer 302. A remote computer 301 may communicate with logic analyzer 302 via a network connection 303. The graphical user interface 305 is operable at the remote computer 301 as well, to allow remote control of the logic analyzer 302.

In the normal operation of a latch or flip-flop, the value present at the D input coincident with the active clock transition will appear at the Q output some brief time (the propagation delay) later. For reliable operation, the D input must remain stable (either high or low) for some time before and after the active clock transition. "Setup time" is defined as the time that the data must remain stable (no transitions) prior to the clock transition. "Hold time" is defined as the time that the data must remain stable after the clock transition. These times are specified in the data sheet for every synchronous digital circuit having both clock and data inputs. If setup or hold times are violated, the Q output may be erroneous or may become metastable.

Figure 4:
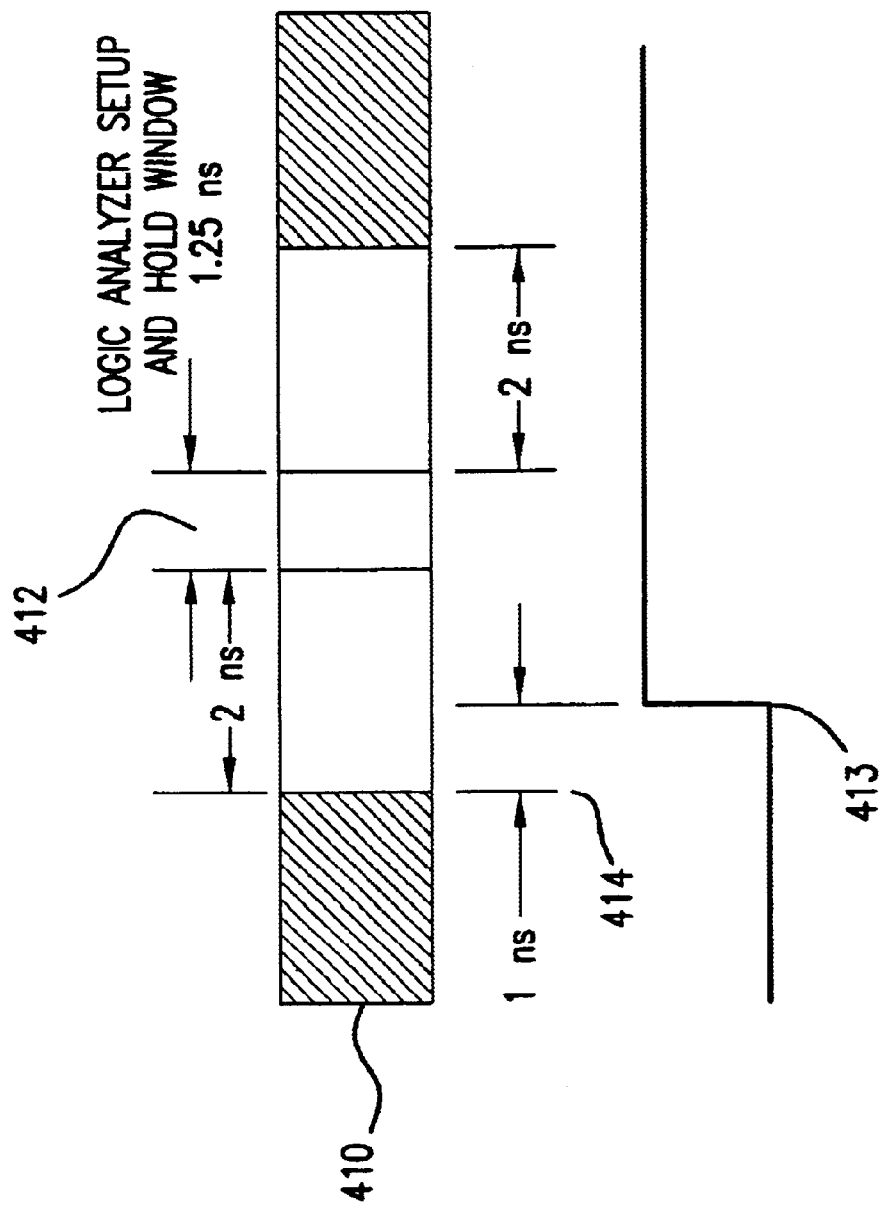
FIG. 4 is an illustration of a data input and a data valid window and setup/hold window.

A logic analyzer operating in state analysis mode latches data appearing at its inputs on each active clock transition supplied by the device under test. Like any other synchronous circuit, the inputs to the logic analyzer must be stable for a certain amount of time before and after the active clock transition. Since the logic analyzer must be usable with a wide range of circuits, the user is able to move the setup/hold window of the logic analyzer to accommodate the incoming signals. The setup/hold window (the sum of setup and hold time) for a single channel of a logic analyzer can typically be 1.25 ns in width. In FIG. 4, the data 410 on a particular input 411 has a data valid window 412 of 5.25 ns. The active clock transition 413 at the input to the logic analyzer is positioned 1 ns after the latest transition 414 at the beginning of the data valid window.

It is preferred that the resolution with which the setup and hold values can be adjusted be as fine as possible. Many logic analyzer achieve adjustment resolution of approximately 100 ps while in some other logic analyzer architectures, the relative delay between data and clock can only be adjusted with 500 ps resolution.

For example, if there is a data valid window of 2.5 ns and a logic analyzer with a 2 ns total setup and hold and 500 ps adjustment resolution, it may not be possible to position the logic analyzers setup and hold window within the data valid window. However, if the logic analyzer has a 1.25 ns setup and hold window that can be adjusted with 100 ps resolution, it can be adjusted for reliable data capture with margin. Obviously, as clock rates increase, the data valid window shrinks, and proper adjustment of the logic analyzer's setup/hold window becomes more critical to making reliable measurements. Until now, the user has had little assistance or feedback in making this critical adjustment.

Figure 5:
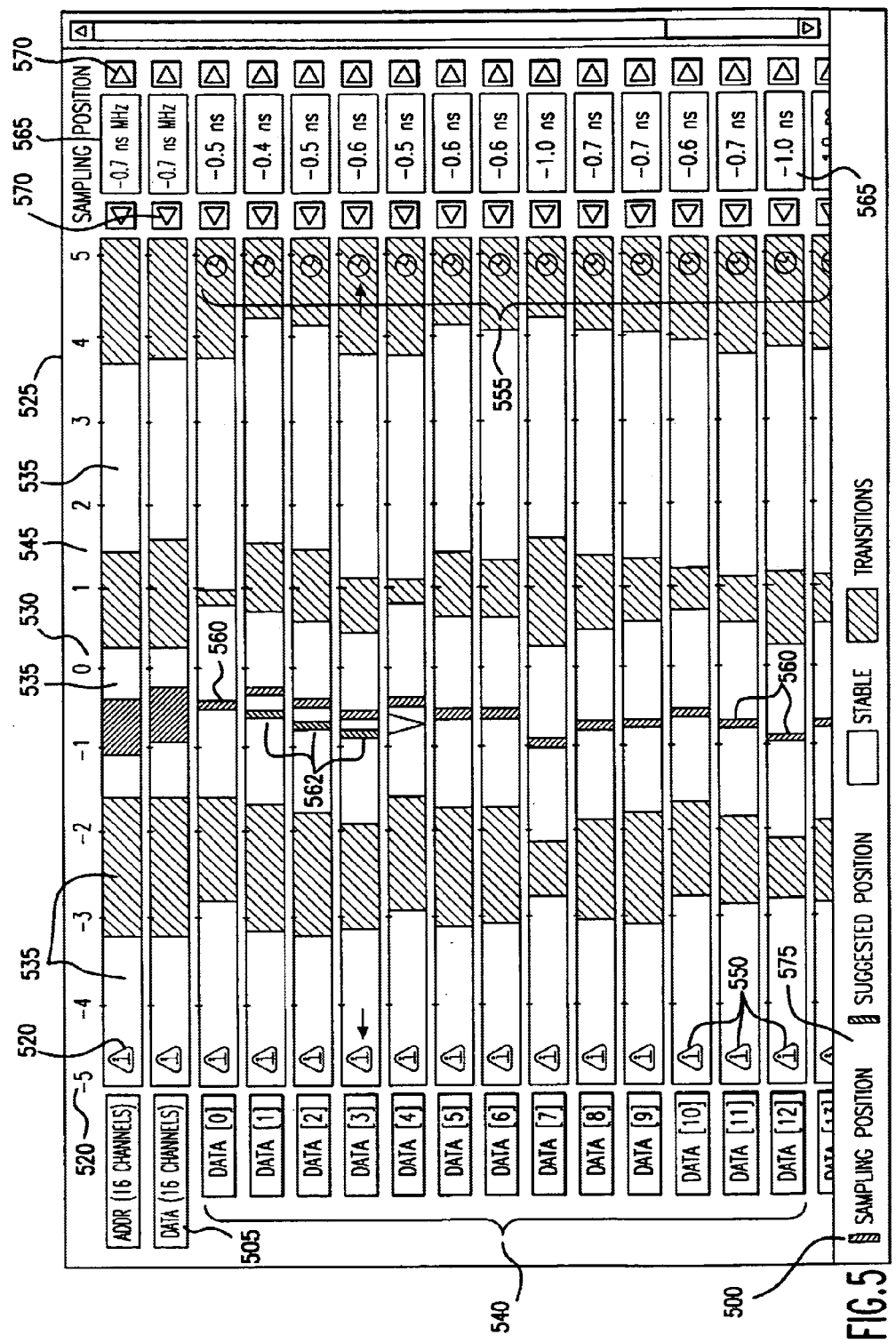
FIG. 5 is a user interface screen in accordance with the invention.

FIG. 5 is a user interface screen 500 illustrating a preferred embodiment of a signal's transitioning and stable regions for positioning a logic analyzer sample position in accordance with the invention. Regions of transition are automatically discovered on all channels in accordance with the teachings of U.S. patent application Ser. No. 09/375,307, filed Aug. 16, 1999 for "System and Method for Adjusting A Sampling Time In a Logic Analyzer." The measurement defines where in time each signal and bus has a stable data valid window and where the data is transitioning and unstable. The data provides the user with a new and unique view into the behavior of the device under test that goes beyond the standard waveform and listing displays currently offered in logic analyzers.

In FIG. 5, a data line 505 is displayed which clearly illustrates the stable region 510 and transitioning region 515 around the clock edge. The data in FIG. 5 is displayed in a 10 ns window (i.e. −5 ns 520 through 5 ns 525) centered on the clock edge 530 (i.e. zero ns). As illustrated, the graphical user interface preferably displays several pieces of information and controls for each signal including: the stable and transitioning regions for each data channel 535 being monitored; a bus/signal label 540; a sample position time scale 545; a plurality of information icons 550; a time stamp icon 555; a graphical representation of suggested sample position (suggested sample position markers) 560 and user selected sample positions (selected sample positions markers) 562; a text display of the selected sample position 565 indicating how far the selected sampling position has been moved to the left or right of the clock edge; sample position scroll buttons 570;and a legend 575. The presentation of the stable and transitioning data alternatively is displayed in preferably three formats, which are shown in FIGS. 6, 7 and 8.

Figure 6:
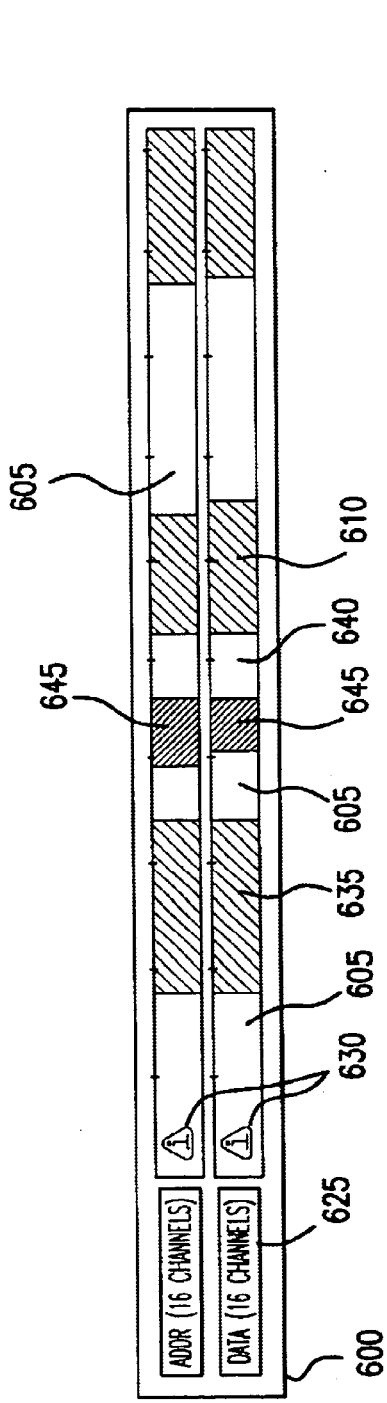
FIG. 6 is a simplified illustration of a bus composite view in accordance with the invention.

FIG. 6 shows a bus composite view 600 of the stable regions 605 and transitioning regions 610 for multiple channels grouped as a bus. As illustrated, the graphical user interface preferably displays the stable region 615 and transitioning regions 620, a bus label for the composite bus 625 and a plurality of information icons 630. The composite representation defines transitioning region 635 as the union of all transition regions in its member channels. The composite representation defines the stable region 640 as the intersection of all stable regions in its member channels. Member channels are all of the signals on the represented bus. The range of sample positions for the various channels is represented by the sample positions indicators 645 centered in the stable regions.

Figure 7:
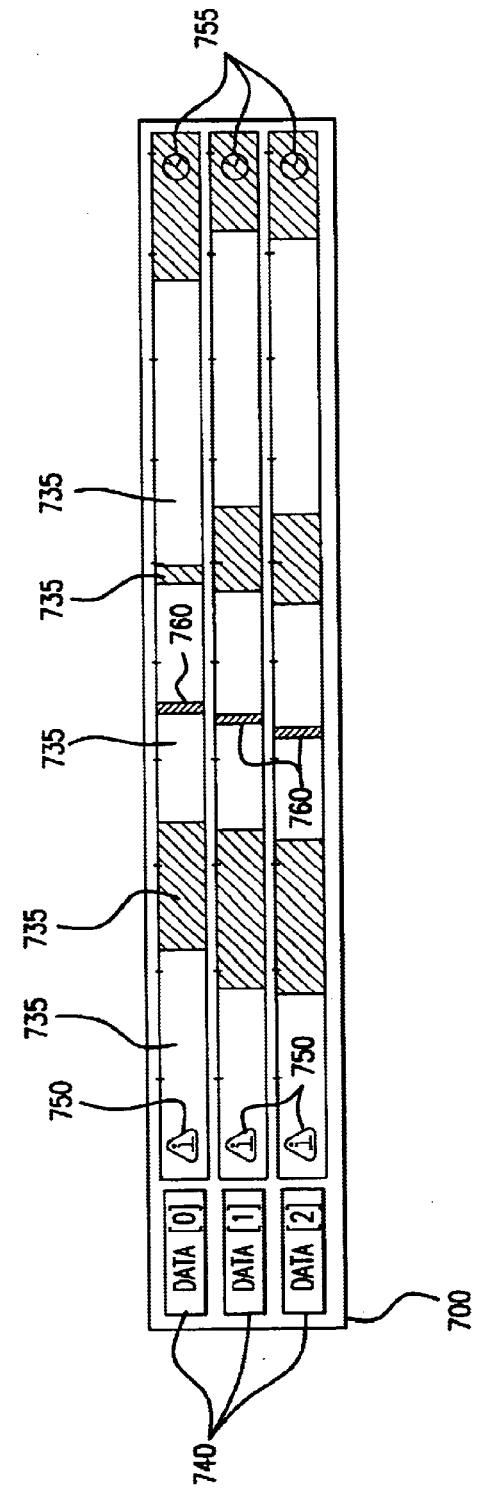
FIG. 7 is a simplified view of the stable and transitioning data display for an individual channels view in accordance with the invention.

FIG. 7 shows a simplified view of the stable and transitioning data display for the individual channels display. FIG. 7 is a simplified view of the individual channels 700 view displayed in connection with FIG. 5. As illustrated, the graphical user interface preferably displays the stable and transitioning region individually for each data channel 735 being monitored, a bus/signal label for each channel 740, a sample position time scale (not shown), a plurality of information icons 750, a time stamp icon 755, a graphical representation of suggested and selected sample positions 760, a text display of the selected sample position (not shown) indicating how far the selected sampling position varies from the suggested position, and a legend (not shown). The display shows the usable width of the stable and transitioning regions for each individual channel. The usable width is the width of the actual data valid window on the signal minus inherent noise in the logic analyzer and further reduced to allow for operating drift in the analyzer during the user's measurement. The sample line 765 centered in the stable region represents the sample position for that individual signal.

Figure 8:
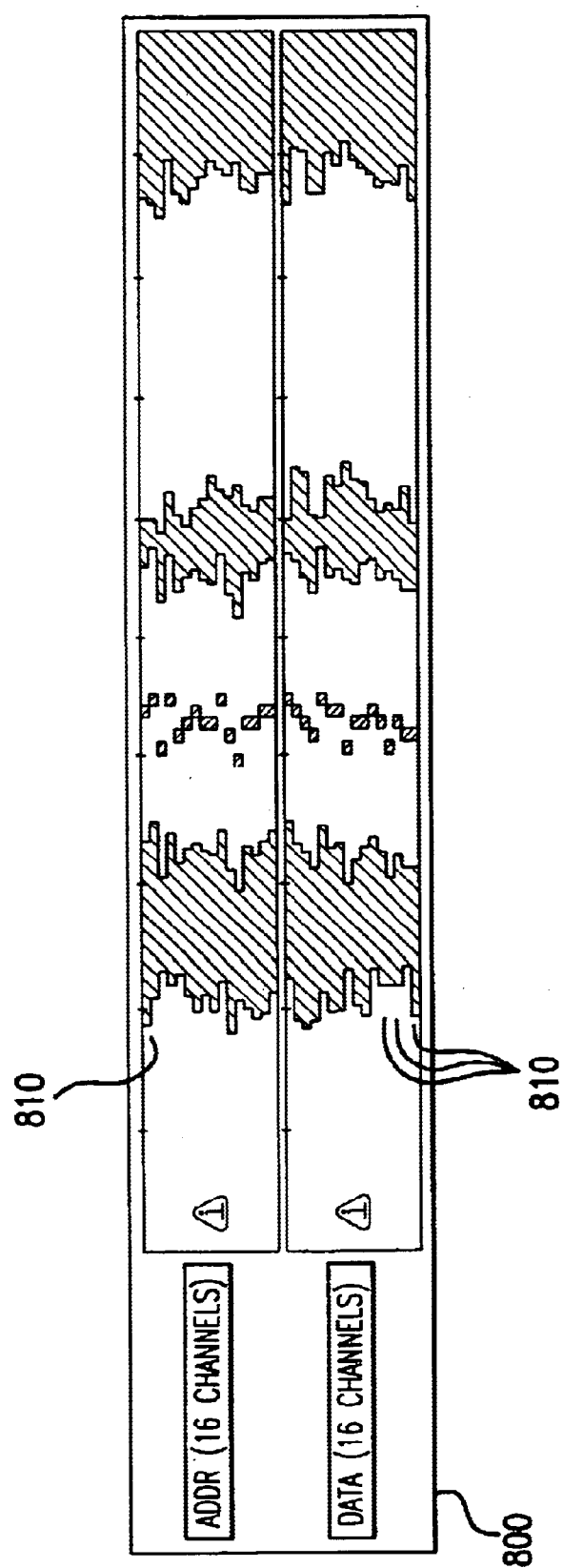
FIG. 8 is a simplified view of two buses in a stack of channels view in accordance with the invention.

FIG. 8 shows an alternative view of a bus in a stack of channels display. This view displays each channel in a bus individually as a single horizontal line. The channels are stacked on top of each other to show the complete bus. This view shows the true width of the stable and transitioning regions for each channel and allows the user to see the skew of any given channel in relationship to the other channels and the possible effects on the data valid window for the bus as a whole. The sample lines scattered in the stable region represent the individual sample positions for each channel.

Figure 9:
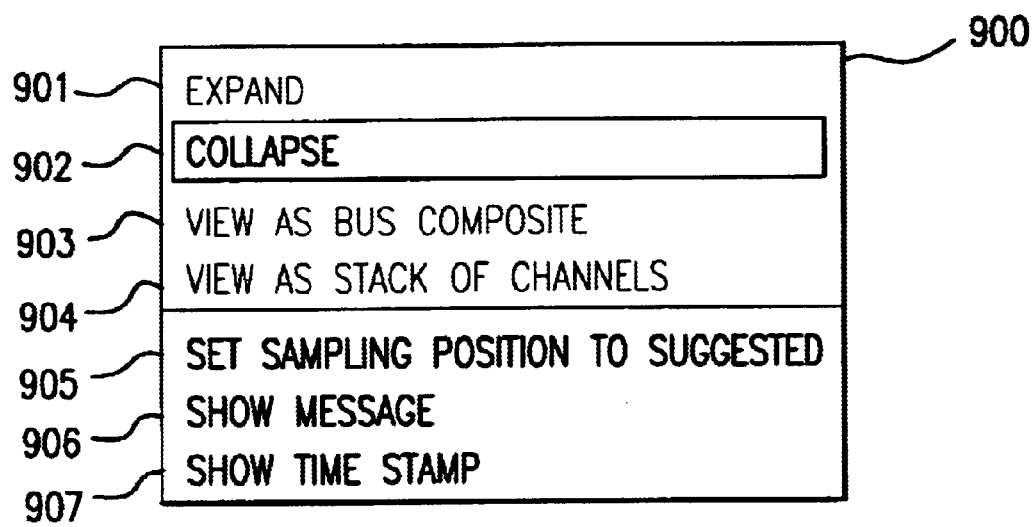
FIG. 9 is a preferred version of the pop-up menu in accordance with the invention.

Regardless of which type of display (i.e. individual channel, composite bus or stacked channel) is used by the user, there are various areas of the display selectable by the user. While the user cannot directly manipulate the position of the stable and transitioning regions, selection of one of these areas access a pop-up menu of interactive options. For instance, selection of one of the stable regions or transitioning regions represented in FIGS. 5, 6, 7 or 8 causes the pop-up menu to appear. FIG. 9 illustrates a preferred version of the pop-up menu 900. The pop-up menu allows the user to select from variety of choices, including "Expand" 901, "Collapse" 902, "View as Bus Composite" 903, "View as Stack of Channels" 904, "Set Sampling Position to Suggested" 905, "Show Message" 906 and "Show Time Stamp" 907. User selection of "expand" 901 in FIG. 9 causes the graphical user interface to expand a composite view of an entire bus into individual signals such as that represented in FIG. 5 or 7. User selection of "collapse" 902 causes the graphical user interface to collapse individual signals into a composite bus display such as that represented in FIG. 6. User selection of "view as bus composite" 903 causes the graphical user interface to set the collapsed bus view of a group of signals to the composite bus view such as that shown in FIG. 6. User selection of "view as stack of channels" 904 causes the graphical user interface to set the collapsed view of a group of signals to the stacked channel view such as that shown in FIG. 8. User selection of "set sampling position to suggested" 905 causes the graphical user interface to set the sample position to the value that was originally defined b the measurement.

Referring again to FIG. 5, for reference purposes, the time scale 545 at the top of the display defines a 10 ns window centered on the clock transition. The clock transition is represented by the 0 ns position 580. The sample position markers 560,562 are selectable by the user. Selection and movement of a selected sample position marker 562 causes the sample position time to change accordingly. In a preferred embodiment, the user can move the analyzer sample positions around the display in 100 ps increments. Preferably, this resolution is approximately the resolution provided by the logic analyzer hardware.

Referring still to FIG. 5, each data line 535 has an optional information icon 550 positioned on the left edge. The information icons 550 are selectable by the user. Preferably, the information icon 550 appears only on data lines that have a message associated with it. Typically, the message is descriptive in nature concerning the particular data line with which it is associated. However, the message can contain any type of message. The message associated with an information icon is displayed in a manner convenient to the user. Preferably, the message is displayed in a message fly-out format (not shown). This type of display causes a text box with the message enclosed to appear over the data line 535 with which it is associated whenever the mouse is hovered over the icon. In alternative versions of the invention, the message box appears in any display format that makes the message available to the user.

Still referring to FIG. 5, each individual signal data line has a time stamp icon 555 on its right edge. The measurements that generate the data displayed on the graphical user interface can be made on all signals, groups of selected signals, or individual signals whenever a user desires to make the measurements. Information associated with the time stamp icon 555 accordingly provides an indication to the user of when each line of data 535 was measured and which lines of data 535 are respectively the oldest or most recent. The time stamp icons 555 are selectable by the user. The time message associated with a time stamp icon is displayed in a manner convenient to the user. Preferably, the message is displayed in a message fly-out format (not shown). This type of display cause a text box with the time message enclosed to appear over the data line 535 with which it is associated when the mouse is hovered over the icon. In alternative versions of the invention, the message box appears in any display format that makes the message available to the user. Further, the message associated with a time stamp icon 555 is displayed in a text format convenient for a user to understand. For instance, the time stamp for a most recent measurement reads "Measured on Dec. 14 09:37:49 1999 (most recent)." Alternatively, the time stamp message for a previous measurement reads, "Measured 7 minutes 30 seconds before most recent." It is understood that the textual content of the message can be in any form capable of conveying time stamp information. Further, two sizes are used for the time stamp icons. The larger size is displayed for channels most recently measured. A smaller size is shown on channels measured earlier.

In addition to displaying the stable and transitioning regions of a signal or bus, each line of data also displays two distinct sampling positions. Referring to FIG. 5, the first is the suggested sampling position indicated by the suggested sampling marker 560 and is represented with a particularly colored line, area or dot. Preferably, the suggested sampling position marker 560 is represented by green but it is understood that any color can be used. The suggested sampling position marker 560 is the position that the system has identified as the optimal sampling position based on the measurements performed on the device under test. These measurements are described and taught in of U.S. patent application Ser. No. 09/375,307, filed Aug. 16, 1999 for "System and Method for Adjusting A Sampling Time In a Logic Analyzer." The location of the suggested sampling position is controlled by the logic analyzer system. It is maintained in the center of the stable region closest to the current position of the selected sample position, described next.

The second sampling position that is displayed is the selected sample position indicated by the selected sample position marker 562 and is represented with a particularly colored line, area or dot. Preferably, the selected sample position is represented by blue, but it is understood that any color can be used. The selected sample position marker 562 is selectable by the user. The user selects and drags the selected sample position marker 562 horizontally to a desired sample location within the display. The selected sample position marker 562 is also controllable by the user via the scroll buttons 570 associated with the text display of the selected sample position 565. Selection of the scroll buttons 570 respectively move the associated selected sampling position marker left or right. Preferably, selection of the selected sampling position marker 562 or the scroll buttons 570 allows the user to move the selected sampling position in 100 ps increments. The selected sample position is the sample position that the logic analyzer will use in subsequent measurements. Preferably, the Default State of the selected sampling position is the same as the suggested sample position. Thus, at default, the selected sample position marker 562 and the suggested sample position marker 560 will coincide.

Figure 10:
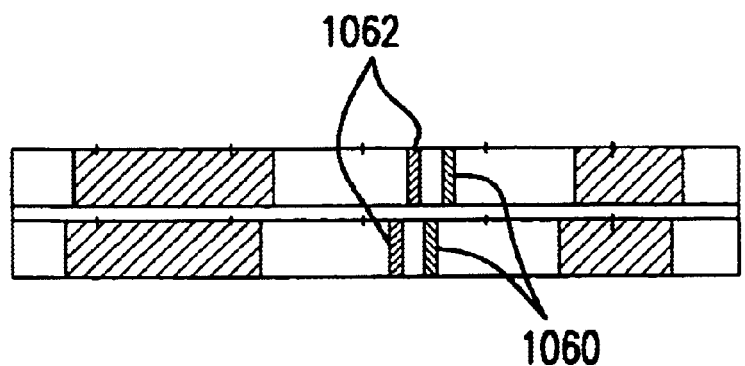
FIG. 10 is a partial view of the sample positions markers for an individual channel view in accordance with the invention.
Figure 11:
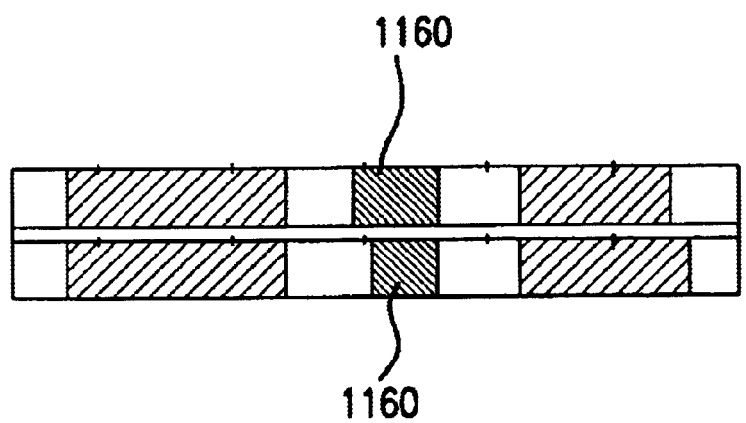
FIG. 11 is a partial view of the sample positions markers for bus composite view in accordance with the invention.
Figure 12:
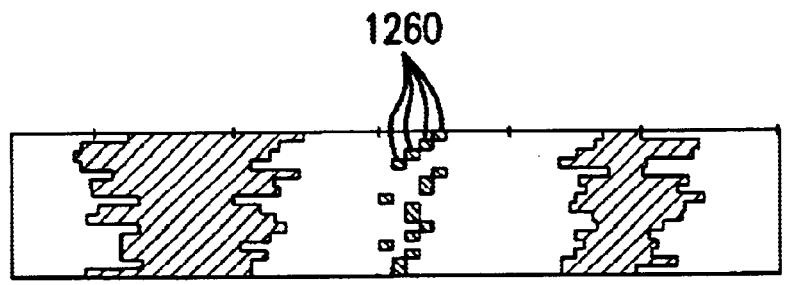
FIG. 12 is a partial view of the sample positions markers for stack of channels view in accordance with the invention.

The graphical representation of both the suggested sample position and the selected sample position can appear in three formats depending on the view desired by the user. FIGS. 10, 11 and 12 represent the preferred graphical representations of the sample position indicators. FIG. 10 shows partial view of the sample position markers for an individual channel display. The suggested sample position marker 1060 and the selected sample position marker 1062 are displayed within the stable region of the data display for the individual channel shown here. Preferably, the widths of the markers 1060, 1062 indicate the resolution of the logic analyzer hardware (e.g. 100 ps). The resolution of the logic analyzer hardware also defines the finest increments in which the sample position can be moved. Alternatively, the width of the markers may be any convenient size for clarity in operation of the user interface.

FIG. 11 shows a partial view of the sample position markers for a bus composite display. The sample position marker 1160 is a rectangular area representing the composite sample positions. This sample position marker 1160 takes a wider rectangular shape because it represents a range of sample position values that exist on the bus' individual channels. In another situation, the individual sample positions may not overlap. In this case multiple blue areas will be shown in the composite view.

FIG. 12 shows a partial view of the sample position markers for a stacked channel display. The sample position markers 1260 are represented by single points for each channel. Preferably, the widths of the markers 1260 indicate the resolution of the logic analyzer hardware (e.g. 100 ps). The resolution of the logic analyzer hardware also defines the finest increments in which the sample position can be moved. Alternatively, the width of the markers may be any in convenient size for clarity in operation of the user interface.

Referring again to FIG. 5, at the right side of the display a text box display 565 is associated with each channel. The text box 565 displays a numerical value for the sample position relative to the clock edge (i.e. 0 ns). As a user selects the selected sample position marker 562 or the left/right sample position scroll buttons 570, the numerical value in the text box 565 changes accordingly.

Also in FIG. 5 is shown a legend 575. The legend 575 is a simple graphical display which indicates the color references in the graphical user interface. For example:

Blue—Actual sample position

Green—Suggested sample position

Light gray—Stable data valid region

Dark gray—Data transitioning region

It is understood that the colors are merely representative and that any color can be used for any category in the legend 575.

While various embodiments of the present invention have been described above, it should be understood that they have been presented by way of example only, and not limitation. For example, exemplary aspects of the present invention have been described in relation to a logic analyzer. It should be apparent to those of ordinary skill in the art that the present invention may be implemented in any signal measurement system that acquires signal data in accordance with a clock or other time reference specification. For example, the present invention may be implemented in a digital oscilloscope or protocol analyzer in which multiple channel data is displayed. Although reference has been made to a sequence of graphical user interfaces to achieve a result, it is understood that additional or alternative sequence steps may be included to achieve the same or similar result. Additionally, although the illustrated embodiment has been described using a particular object-oriented implementation, it is understood that this is by way of example only. The same or similar functionality may be implemented using other object-oriented arrangements as well as structured programming languages, firmware, or hardware. Thus, the breadth and the scope of the present invention are not limited by any of the above exemplary embodiments, but are defined only in accordance with the following claims and their equivalents.

What is claimed is:

1. In a graphical user interface of a logic analyzer, a system for enabling a user to position the logic analyzer's sample position within a data valid window by enabling direct graphical manipulation of sample positions relative to an actual data valid window on a device under test, wherein: (1) the data valid window is a stable and transitioning regions data display, (2) direct graphical manipulation of sample positions is made in 100 ps increments and (3) the data valid window is automatically discovered on all channels.

2. The system of claim 1, wherein:

the data valid window defines the stable data valid regions and transitioning regions for each signal relative to a clock transition;

the data valid window is displayed as a bus composite view;

a sample position marker indicating the range of sample positions for the represented bus is displayed;

the graphical user interface further displays a plurality of information and control items;

the plurality of information and control items comprises, a bus/signal label, a sample position time scale, a plurality of information icons, a plurality of time stamp icons, a graphical representation of a suggested sample position, a text display of the selected sample position, a plurality of sample position scroll buttons, and a legend;

graphical selection of a stable region or a transitioning region causes a popup menu to be displayed; and the pop-up menu comprises a list of graphically selectable options comprising a) expand;

b) collapse;

c) view as bus composite;

d) view as stack of channels;

e) set sampling position to suggested;

f) show message; and g) show time stamp.

3. The system of claim 1, wherein:

the data valid window defines the stable data valid regions and transitioning regions for each signal relative to a clock transition;

the data valid window is displayed as an individual channels view with each channel displayed individually;

the graphical user interface further displays a plurality of information and control items;

said plurality of information and control items comprising a bus/signal label, a sample position time scale, a plurality of information icons, a plurality of time stamp icons, a graphical representation of a suggested sample position, a plurality of text display of the selected sample position, a plurality of sample position scroll buttons associated with said plurality of text displays, and a legend;

said plurality of information icons are graphically selectable;

selection of one of said plurality of information icons causes a text message to be displayed on said graphical user interface; and said text message is displayed in a message fly-out format.

4. The system of claim 1, wherein:

the data valid window defines the stable data valid regions and transitioning regions for each signal relative to a clock transition;

the data valid window is displayed as an individual channels view with each channel displayed individually;

the graphical user interface further displays a plurality of information and control items;

said plurality of information and control items comprising a bus/signal label, a sample position time scale, a plurality of information icons, a plurality of time stamp icons, a graphical representation of a suggested sample position, a plurality of text display of the selected sample position, a plurality of sample position scroll buttons associated with said plurality of text displays, and a legend;

said plurality of time stamp icons are graphically selectable;

selection of one of said plurality of time stamp icons causes a text message to be displayed on said graphical user interface;

said text message contains relative measurement time information; and said text message is displayed in a message fly-out format.

5. The system of claim 4, wherein graphical selection of a stable region or a transitioning region causes a text message to be displayed on said graphical user interface.

6. The system of claim 5, wherein the pop-menu comprises a list of graphically selectable options.

7. In a graphical user interface of a signal measurement system, a system for enabling a user to position the signal measurement system's sample position within a data valid window by enabling direct graphical positioning of sample positions relative to an actual data valid window on a device under test, wherein;
  a) the signal measurement system is a logic analyzer;
  b) the data valid window is a stable and transitioning regions data display
  c) the data valid window is automatically discovered on all channels;
  d) the data valid window is displayed as an individual channels view with each channel displayed individually;
  e) the graphical user interface further displays a plurality of information and control items;
  f) said plurality of time stamp icons are graphically selectable;
  e) two distinct sampling positions indicators are displayed in each of said channels;
  h) a first of said two distinct sampling positions indicators represents a suggested sampling position and a second of said two distinct sampling positions represents a selected sampling position;
  i) said first indicator indicates a sampling position identified by the signal measurement system as the optimal sampling position and said second indicator is graphically selectable and indicates a sampling position selected by the user;
  j) selection of said second indicator causes said selected sampling position to change;
  k) graphical selection of a stable region or a transitioning region causes a text message to be displayed on said graphical user interface; and
  l) the pop-up menu comprises a list of graphically selectable options, said options comprising expand, collapse, view as bus composite, view as stack of channels, set sampling position to suggested, show message and show time stamp.

8. In a graphical user interface of a signal measurement system, a method for enabling a user to position the signal measurement system's sample position within a data valid window by enabling direct graphical positioning of sample positions relative to an actual data valid window on a device under test, comprising the steps of:
  a) automatically discovering the data valid windows on all channels;
  b) displaying the data valid window as an individual channels view with each channel displayed individually;
  c) displaying stable and transitioning regions in said data valid window;
  d) displaying two distinct sampling positions indicators in each of said channels, wherein a first of said two distinct sampling positions indicators represents a suggested sampling position and a second of said two distinct sampling positions indicators represents a selected sampling position;
  e) modifying the sampling position of said signal measurement system in response to graphical movement of said second indicator; and
  f) displaying a plurality of graphically selectable information and control items, said plurality of information and control items comprising a bus/signal label, a sample position time scale, a plurality of information icons, a plurality of time stamp icons, a graphical representation of a suggested sample position, a text display of the selected sample position, a plurality of sample position scroll buttons, and a legend;
wherein said text message is displayed in a message fly-out format.

9. The method of claim 8, wherein graphically selecting one of said plurality of time stamp icons causes a text message to be displayed on said graphical user interface and said time stamp icon text message is displayed in a message fly-out format.

10. The method of claim 8, further comprising the step of graphically selecting one of said stable regions or one of said transitioning regions, causing a pop-up menu to be displayed on said graphical user interface and wherein said pop-up menu comprises a list of options including at least:
  1) expand;
  2) collapse;
  3) view as bus composite;
  4) view as stack of channels;
  5) set sampling position to suggested; and
  6) show message; and
  7) show time stamp.

11. The method of claim 10, further comprising the step of graphically selecting the "collapse" option from said pop-up menu causing said individual channels view to collapse into a composite bus view.

12. The method of claim 11, wherein said composite view defines the absolute largest transitioning region and the absolute smallest stable region of all signals of the represented bus.

* * * * *

UNITED STATES PATENT AND TRADEMARK OFFICE
CERTIFICATE OF CORRECTION

PATENT NO. : 6,799,127 B1
DATED : September 28, 2004
INVENTOR(S) : David N. Sontag et al.

It is certified that error appears in the above-identified patent and that said Letters Patent is hereby corrected as shown below:

Column 1,
Line 34, after "under test's", delete "dock" and insert therefor -- clock --.
Line 52, after "device under test", delete "is".

Column 2,
Line 19, after "regions are relative to the", delete "dock" and insert therefor -- clock --.

Column 11,
Line 15, before "two distinct sampling", delete "e)" and insert therefor -- g) --.

Signed and Sealed this

Sixteenth Day of August, 2005

JON W. DUDAS
*Director of the United States Patent and Trademark Office*